(12) United States Patent
Yamada et al.

(10) Patent No.: US 6,458,713 B1
(45) Date of Patent: Oct. 1, 2002

(54) METHOD FOR MANUFACTURING SEMICONDUCTOR DEVICE

(75) Inventors: Nobuhide Yamada, Tokyo; Rempei Nakata, Kamakura; Hideshi Miyajima; Motonobu Kawai, both of Yokohama, all of (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 13 days.

(21) Appl. No.: 09/604,726

(22) Filed: Jun. 28, 2000

(30) Foreign Application Priority Data

Jun. 28, 1999 (JP) .............................. 11-182057
Jun. 30, 1999 (JP) .............................. 11-186996

(51) Int. Cl.$^7$ ............................................ H01L 21/31
(52) U.S. Cl. ..................................................... 438/758
(58) Field of Search ........................ 427/372.2; 438/584, 438/632, 758, 780, 781, 782, 783, 784

(56) References Cited

U.S. PATENT DOCUMENTS 6,248,661 B1 * 6/2001 Chien et al. ................. 438/632

FOREIGN PATENT DOCUMENTS

JP          62-113443          5/1987

* cited by examiner

Primary Examiner—Michael Sherry
Assistant Examiner—Lisa Kilday
(74) Attorney, Agent, or Firm—Finnegan, Henderson, Garrett & Dunner, L.L.P.

(57) ABSTRACT

A method of forming a film, which comprises the steps of coating a liquid raw material comprising a precursor of film-forming material dissolved in a solvent, on a surface of substrate, and forming a solid film on the surface of substrate by subjecting the substrate to a plurality of heat treatments differing in heating temperature from each other. The heat treatments differing heating temperatures from each other are performed over the same single hot plate. The film to be formed may be an organic SOG film. There is also disclosed a method of manufacturing a semiconductor device, which comprises the steps of coating a liquid raw material for forming an organosilicon oxide film on a surface of semiconductor substrate, and subjecting the semiconductor substrate to a first heat treatment where the semiconductor substrate is heated in an oxidizing atmosphere and at a temperature of 200° C. or more.

18 Claims, 5 Drawing Sheets

METHOD FOR MANUFACTURING SEMICONDUCTOR DEVICE

CROSS-REFERENCE TO RELATED APPLICATIONS

This application is based upon and claims the benefit of priority from the prior Japanese Patent Applications No. 11-182057, filed Jun. 28, 1999; and No. 11-186996, filed Jun. 30, 1999, the entire contents of which are incorporated herein by reference.

BACKGROUND OF THE INVENTION

This invention relates to a method for manufacturing a semiconductor device, and in particular to a method of forming an insulating film of low dielectric constant, which is useful in a semiconductor device.

Due to the increasing integration and speed of semiconductor device through the miniaturization of semiconductor elements in recent years, the parasitic capacity of wiring now becomes a factor giving a great influence on the operation speed and power consumption of the device. Under the circumstances, there is now intensively studied for finding an insulating film having a dielectric constant which is lower than that of the conventional $SiO_2$ film.

As one of candidates for such a material, an insulating film of low dielectric constant represented by an organosilicon oxide film has been studied. This organosilicon oxide film is formed by a coating method. Namely, a precursor of the organosilicon oxide is dissolved in a solvent to obtain a liquid raw material or so-called varnish, which is then coated on a substrate and heated so as to volatilize the solvent and to perform the crosslinking (polymerization) of the precursor, thereby obtaining the organosilicon oxide film.

The insulating film formed through a coating method of this kind is featured in that the properties thereof such as dielectric constant and hygroscopicity are greatly influenced by the atmosphere of the heating step. Therefore, once it is desired to obtain an insulating film of stable properties, the atmosphere of the heating step is required to be precisely controlled.

An electric furnace of batch type which is now generally employed is defective in that it is difficult to make uniform the atmosphere inside the furnace, resulting in that the uniformity of temperature throughout the surface of the substrate as well as the reproducibility of heating condition for each of substrates would be deteriorated.

With a view to overcome these problems, there has been proposed a method of forming an insulating film by means of a coating method where a single wafer type hot plate is employed. FIG. 1 illustrates a schematic view of a conventional insulating film-forming device for executing the aforementioned coating method.

In the formation of an insulating film by means of coating method, a heat treatment is required to be performed after the coating of a varnish on the surface of substrate in order to volatilize the solvent and to achieve the crosslinking of the precursor of the organosilicon oxide contained in the varnish.

The conventional insulating film-forming device shown in FIG. 1 is designed to execute this heat treatment by making use of a plurality of hot plates.

Specifically, first of all, a varnish comprising polymethyl siloxane dissolved in a solvent is coated on the surface of an Si substrate (not shown) by making use of a coater 81, and then, the Si substrate is transferred by means of a transferring arm 82 onto a hot plate 83 maintained at a temperature of 80° C. After being heat-treated for one minute on the hot plate 83, the Si substrate is transferred onto another hot plate 84 maintained at a temperature of 200° C. so as to be heat-treated for one minute thereon. Thereafter, the Si substrate is again transferred onto still another hot plate 85 maintained at a temperature of 450° C. so as to be heat-treated for thirty minutes thereon, thereby obtaining an aimed insulating film.

According to this method where a plurality of hot plates are employed, it is possible to enhance the uniformity of temperature throughout the surface of the substrate and also to enhance the reproducibility of sintering condition for every one of substrate. This insulating film formed by making use of a plurality of hot plates however is accompanied with problems that the crack-resistant film thickness and mechanical strength thereof are relatively low as compared with an insulating film formed by making use of an electric furnace. By the way, this phrase of "crack-resistant film thickness" means a minimum film thickness which may allow the generation of cracking in the film due to an stress of the film per se. An insulating film formed by means of coating method is required to be large in crack-resistant film thickness.

FIG. 2 shows a result investigated of a relationship between the relative dielectric constant and the crack-resistant film thickness in an insulating film formed according to the aforementioned conventional method. The relative dielectric constant of the insulating film was adjusted in this case by decreasing the concentration of methyl group in the liquid raw material. It will be seen from FIG. 2 that where the relative dielectric constant is 3.2 or less, the crack-resistant film thickness decreases in proportion to a decrease of the relative dielectric constant.

The reasons for the deterioration of the crack-resistant film thickness and mechanical strength of the insulating film can be attributed to as follows. Namely, according to the aforementioned conventional method, since a thermal history is applied as shown in FIG. 3 to the film as the film is being formed, the temperature of substrate is lowered on the occasion of transferring the substrate from one hot plate to the next hot plate, but the temperature of substrate is caused to sharply increase immediately after the film is mounted on the next hot plate.

Therefore, in the case of the aforementioned conventional method, a thermal stress due to the lowering of substrate temperature as mentioned above is imposed on the film being formed and incomplete in crosslinking, which phenomenon is assumed to be one of the reasons for deteriorating the crack-resistant film thickness and mechanical strength of the film.

Further, in the case of the aforementioned conventional method, the generation of crosslinking defect as well as porosity is caused to increase in the film due to a sharp increase in temperature of the substrate as mentioned above, which phenomenon is also assumed to be one of the reasons for deteriorating the crack-resistant film thickness and mechanical strength of the film. This phenomenon is also a cause for the generation of surface ruggedness of the film.

On the other hand, when an insulating film is to be formed by means of coating method, the volatilization of solvent is generally performed at a temperature of not more than 200° C. and the crosslinking reaction is performed at a temperature of not less than 400° C.

By the way, according to the conventional heat treatment of the film, an unreacted portion is caused to remain in the film, thereby making the film unstable, thus raising problems such as degassing, moisture absorption, an increase in relative dielectric constant, the generation of cracks, etc.

As mentioned above, according to the conventional method of forming an insulating film by means of a coating method using hot plates, it is certainly possible to enhance the uniformity of temperature throughout the surface of the substrate and also to enhance the reproducibility of sintering condition for every one of substrate. However, the resultant insulating film is accompanied with problems that the crack-resistant film thickness and mechanical strength thereof are lowered.

Further, the conventional heat treatment is defective in that since an unreacted portion is caused to remain in the film, the resultant film becomes unstable, thereby raising problems such as degassing, moisture absorption, an increase in relative dielectric constant, the generation of cracks, etc.

BRIEF SUMMARY OF THE INVENTION

Therefore, an object of this invention is to provide a method of forming a film, which is capable of preventing the crack-resistant film thickness and mechanical strength of the film from being deteriorated.

Another object of this invention is to provide a method of manufacturing a semiconductor device, which comprises a step of forming a film, which is capable of preventing the crack-resistant film thickness and mechanical strength of the film from being deteriorated.

A further object of this invention is to provide a method of manufacturing a semiconductor device, which is capable of improving the crack resistance of an organosilicon oxide film.

A still another object of this invention is to provide a method of manufacturing a semiconductor device, which is capable of improving the crack resistance of an organosilicon oxide film, and which is capable of suppressing degassing, moisture absorption, and an increase of relative dielectric constant.

According to this invention, there is provided a method of forming a film, which comprises the steps of:

coating a liquid raw material comprising a precursor of film-forming material dissolved in a solvent on a surface of substrate; and forming a solid film on the surface of the substrate by subjecting the substrate to a plurality of heat treatments differing in heating temperature from each other;

wherein the heat treatments differing heating temperatures from each other are performed over the same single hot plate.

Further, according to this invention, there is also provided a method of manufacturing a semiconductor device, which involves a film-forming process, the film-forming process comprising the steps of:

coating a liquid raw material comprising a precursor of film-forming material dissolved in a solvent, on a surface of substrate; and forming a solid film on the surface of the substrate by subjecting the substrate to a plurality of heat treatments to heat the substrate at different temperatures, thereby allowing the precursor to take place a polymerization reaction thereof;

wherein the heat treatments to heat the substrate at different temperatures are performed over the same single hot plate and raising the temperature at a rate of not more than 200° C./min. during the polymerization reaction.

Further, according to this invention, there is also provided a method of manufacturing a semiconductor device, which involves a film-forming process, the film-forming process comprising the steps of:

coating a liquid raw material comprising a precursor of film-forming material dissolved in a solvent, on a surface of substrate; and forming a solid film on the surface of substrate by subjecting the substrate to a plurality of heat treatments to heat the substrate at different temperatures;

wherein the heat treatments to heat the substrate at different temperatures are performed over the same single hot plate, subjecting the substrate to a heat treatment where the substrate is heated at a temperature of 200° C. or more, and to another heat treatment where the substrate heated to a temperature of 200° C. or more is further heated raising the temperature at a rate of not more than 200° C./min.

Further, according to this invention, there is also provided a method of manufacturing a semiconductor device, which comprises the steps of:

coating a liquid raw material for forming an organosilicon oxide film on a surface of semiconductor substrate; and subjecting the semiconductor substrate to a heat treatment where the semiconductor substrate is heated in an oxidizing atmosphere and at a temperature of 200° C. or more.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
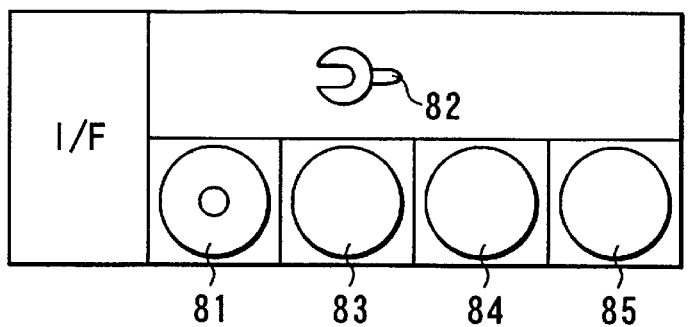
FIG. 1 is a schematic view illustrating a conventional film-forming apparatus.
Figure 2:
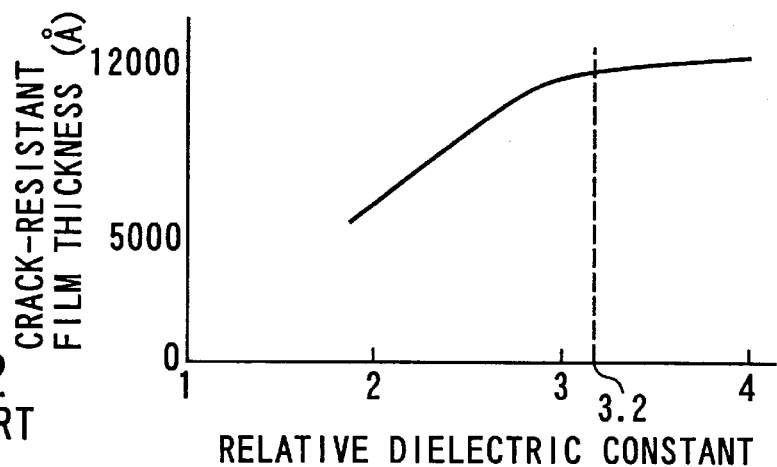
FIG. 2 is a graph illustrating a relationship between the relative dielectric constant of an insulating film obtained according to a conventional film-forming method and the crack-resistant film thickness of the insulating film.
Figure 3:
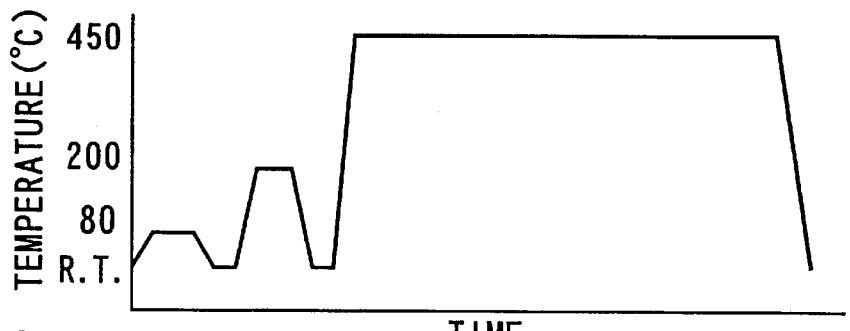
FIG. 3 is a graph illustrating a thermal history of an Si substrate in a conventional film-forming method.

A first aspect of this invention is featured in that on the occasion of forming a solid film on a substrate by subjecting the substrate coated with a liquid raw material comprising a precursor of film-forming material dissolved in a solvent to a plurality of heat treatments to heat said substrate at different temperatures, the heat treatments are performed over the same single hot plate.

When a plurality of heat treatments to heat said substrate at different temperatures are performed over the same single hot plate, the transfer of a substrate from one hot plate to the next hot plate that has been conducted according to the prior art is no more required, so that it is now possible to obviate the cause for the thermal stress resulting from the transfer of substrate, i.e. the deterioration of crack-resistant film thickness and mechanical strength of the film. Therefore, it is possible according to the first aspect of this invention to provide a method of forming a film as well as a method of manufacturing a semiconductor device which enable to prevent the crack-resistant film thickness and mechanical strength of the film from being deteriorated.

Further, according to studies made by the present inventors, it has been found that if the substrate is heated raising the temperature at a rate of not more than 200° C./min. when the polymerization reaction of the precursor contained in a liquid raw material is being taken place, more specifically when the temperature of substrate is 200° C. or more, the crack-resistant film thickness and mechanical strength of the resultant film can be effectively enhanced.

The film to be formed according to the first aspect of this invention should preferably be 3.2 or less in relative dielectric constant. This insulating film may contain Si and O, or may be an SOG (spin on glass) film, in particular, an organic SOG film (organosilicon oxide film).

A second aspect of this invention is featured in that a semiconductor substrate coated thereon with a liquid raw material for forming an organosilicon oxide film is subjected to a heat treatment where the semiconductor substrate is heated in an oxidizing atmosphere and at a temperature of 200° C. or more.

The present inventors have found that when Si—$OCH_3$ is left remained in the organosilicon oxide film, the crack resistance of the film would be deteriorated. This invention has been achieved based on this finding, and is featured in that the quantity of residual Si—$OCH_3$ in the organosilicon oxide film is reduced by heating the organosilicon oxide film at a temperature of 200° C. or more, thereby improving the crack resistance of the organosilicon oxide film.

By the way, when the quantity of residual Si—$CH_3$ is reduced, it will invite an increase of degassing, moisture absorption and relative dielectric constant. It has been also made clear that when the substrate is heated in an oxidizing atmosphere and at a temperature exceeding 350° C., the quantity of residual Si—$CH_3$ can be reduced, increasing the relative dielectric constant of the resultant film. Therefore, when the organosilicon oxide film is heated in a non-oxidizing atmosphere and at a temperature of 400° C. or more after the organosilicon oxide film is heated in an oxidizing atmosphere and at a temperature ranging from 200° C. to 350° C. so as to reduce the residual Si—$OCH_3$, it becomes possible to allow the crosslinking reaction to take place without further minimizing the quantity of residual Si—$CH_3$, and hence, the crack resistance of the film can be improved and at the same time, a rise in degassing, moisture absorption and relative dielectric constant can be suppressed.

The organosilicon oxide film to be formed according to the second aspect of this invention may contain Si, $CH_3$ and O.

The organosilicon oxide film can be heated in an oxidizing atmosphere and at a temperature ranging from 250° C. to 350° C. As for the oxidizing atmosphere, it is possible to employ an air or a gas containing oxygen. On the other hand, as for the non-oxidizing atmosphere, it is possible to employ a nitrogen gas or argon gas. The non-oxidizing atmosphere may contain a small amount of oxygen.

The organosilicon oxide film can be formed by means of a chemical vapor deposition method or a coating method. As for the heat treatment, it is possible to employ a hot plate or a diffusion furnace.

The organosilicon oxide film that can be formed according to the aforementioned first or second aspect of this invention can be represented by the following chemical formula for instance:

wherein m is positive number e.g., 3/2, R denotes alkyl group, e.g., methyl group, and n is positive number.

Next, various preferable examples according to this invention will be explained with reference with drawings.

EXAMPLE 1

Figure 4:
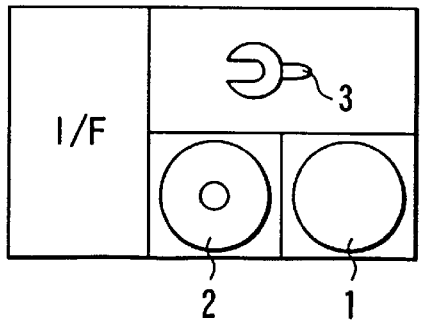
FIG. 4 is a schematic view illustrating a film-forming apparatus according to a first example of this invention.

FIG. 4 shows a schematic view illustrating a film-forming apparatus according to a first example of this invention. The point of this film-forming apparatus which differs mainly from the conventional film-forming apparatus is that the number of hot plate 1 required for treating a single sheet of substrate is only one. Therefore, when the film-forming apparatus is designed to simultaneously treat a plural number of substrates, the number of hot plate 1 to be installed in the film-forming apparatus would become a plural number in total or equal to the number of substrates to be simultaneously treated. The hot plate 1 is provided therein with a heater such as a resistance heater and a lamp heater, so that the hot plate 1 can be set to a desired temperature. In FIG. 4, the reference numeral 2 denotes a coater, and 3 denotes a transferring arm.

According to this example, a film can be formed as follows. Namely, an Si substrate is placed on the hot plate 1, and then, the temperature of the substrate as well as the rate of temperature rise of the substrate are controlled through the adjustment of the hot plate 1, thereby forming the film by making use of only a single sheet of hot plate 1. Followings are more detailed explanations of forming the film according to this example.

First of all, a varnish comprising a precursor of polymethyl siloxane dissolved in a solvent (such as propylene grycol monoethyl ether) is coated on an Si substrate (not shown) by making use of a coater 2.

Figure 5:
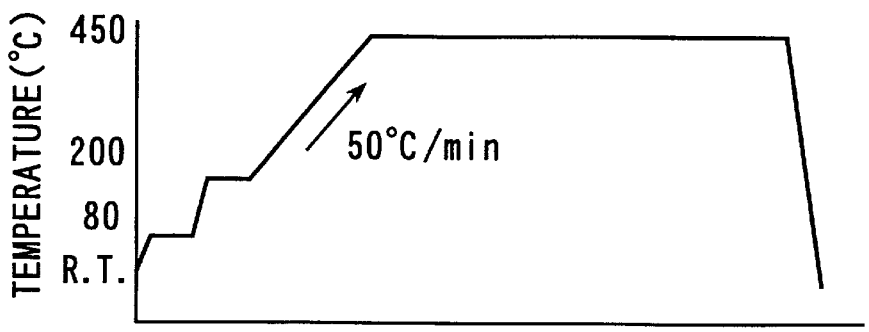
FIG. 5 is a graph illustrating a thermal history of an Si substrate in a film-forming method according to a first example of this invention.

Then, the Si substrate is transferred by means of a transferring arm 3 onto the hot plate 1 heated to a temperature of 80° C. and subjected to the heat treatment thereof for one minute. Thereafter, the heater output of the hot plate 1 is increased to raise the temperature of the Si substrate up to 200° C. with the Si substrate being kept mounted on the hot plate 1, thereby performing additional heat treatment for one minute. Then, after the temperature of the Si substrate is raised up to 450° C. at a rate of 50° C./min., the Si substrate is subjected to additional heat treatment at a temperature of 450° C. for 30 minutes. FIG. 5 shows a thermal history of the Si substrate in the aforementioned heat treatment.

Figure 6:
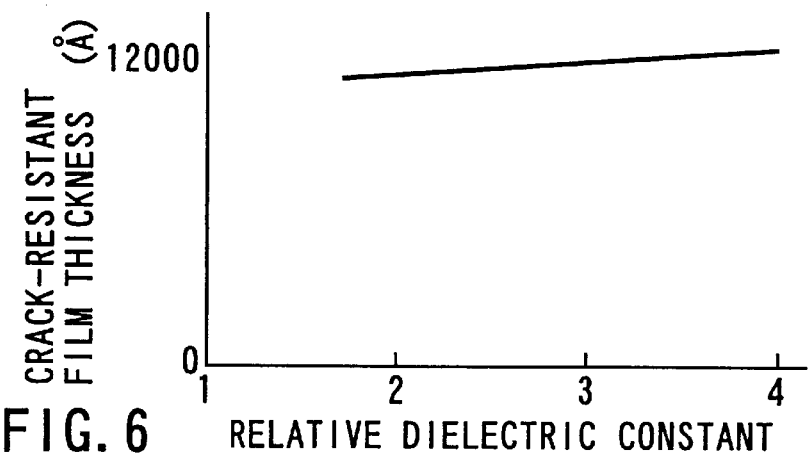
FIG. 6 is a graph illustrating a relationship between the relative dielectric constant of an insulating film obtained according to a first example of this invention; and the crack-resistant film thickness of the insulating film.

FIG. 6 illustrates a relationship between the relative dielectric constant of the insulating film obtained according to the aforementioned method and the crack-resistant film thickness of the insulating film. The relative dielectric constant of the insulating film was adjusted in this case by decreasing the concentration of methyl group in the liquid raw material. Further, the assessment of the crack-resistant film thickness of the insulating film was performed by irradiating a light beam onto a sample to see if a scattering of light beam can be observed or not. It will be seen from FIG. 6 that even if the relative dielectric constant was 3.2 or less, the crack-resistant film thickness was not sharply decreased.

Figure 7:
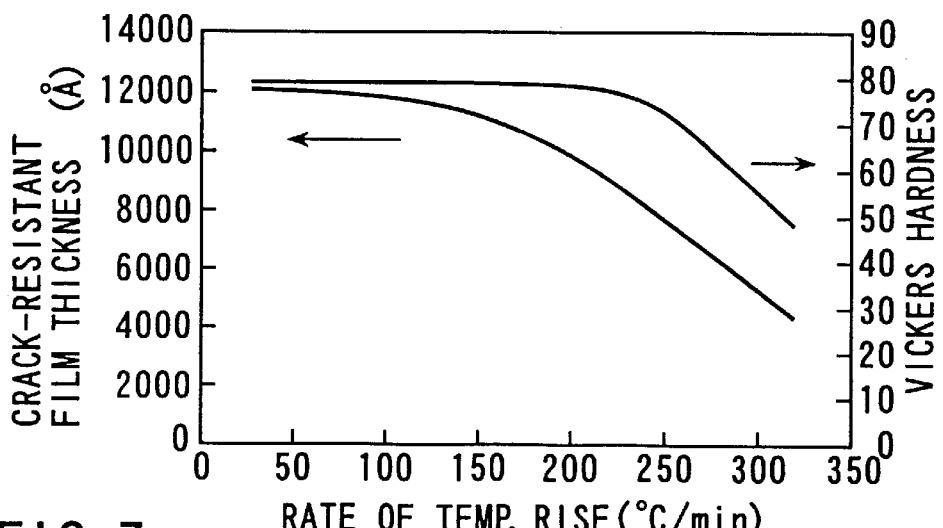
FIG. 7 is a graph illustrating a relationship between the rate of temperature rise until the temperature of substrate reaches 450° C. and the crack-resistant film thickness of the insulating film, and a relationship between the rate of temperature rise until the temperature of substrate reaches 450° C. and the Vickers hardness of the insulating film.

FIG. 7 shows a relationship between the rate of temperature rise until the temperature of substrate reaches 450° C. and the crack-resistant film thickness of the resultant insulating film having a relative dielectric constant of 2.5, and a relationship between the rate of temperature rise until the temperature of substrate reaches 450° C. and the Vickers hardness of this insulating film.

It will be seen from FIG. 7 that when the temperature of substrate is raised at a rate of not more than 200° C./min., it is possible to obtain an insulating film exhibiting a high Vickers hardness, whereas when the temperature of substrate is raised at a rate of not more than 100° C./min., it is possible to obtain an insulating film exhibiting not only a high Vickers hardness but also a high crack-resistant film thickness.

According to this example, since a plural number of heat treatments required for achieving the sintering of the insulating film can be performed by making use of only a single sheet of hot plate 1 which is enabled to control the rate of temperature rise thereof, the configuration of the film-forming apparatus can be made smaller in size as compared with the conventional apparatus, and at the same time, the atmosphere of the heating step can be precisely controlled.

Further, since the heat treatment can be performed by making use of only a single sheet of hot plate 1, the transfer of the substrate from one hot plate to the next hot plate as in the case of the conventional method can be dispensed with, so that it is possible to remove the thermal stress resulting from the transfer of substrate (i.e. a temporary cooling or a sharp temperature rise during sintering), i.e. to remove the causes for the deterioration of the crack-resistant film thickness and of the mechanical strength of the insulating film.

Further, when the temperature of substrate is raised at the aforementioned rate, it is possible to ensure a sufficient crack-resistant film thickness and mechanical strength of the insulating film.

EXAMPLE 2

Figure 8:
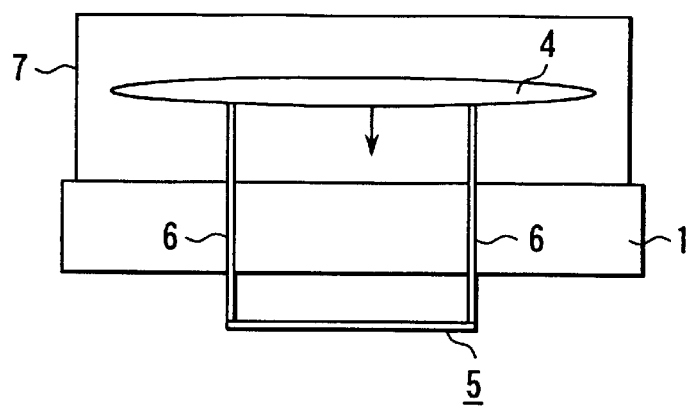
FIG. 8 is a schematic view illustrating a film-forming apparatus according to a second example of this invention.

FIG. 8 shows a schematic view illustrating a film-forming apparatus according to a second example of this invention. The point of this film-forming apparatus which differs mainly from the film-forming apparatus of Example 1 is that the distance between the hot plate 1 and an Si substrate 4 is made variable by means of a supporting member 5. This supporting member 5 comprises a plurality of pins 6, and the Si substrate 4 is supported by these pins 6. The number of pins 6 may be three for instance.

These pins 6 are installed passing through the hot plate 1 and enabled to move up and down at a desired speed by means of a motor mechanism or a pneumatic mechanism (both not shown) so as to be set at a desired height. The temperature of the substrate can be controlled by adjusting the height of these pins 6, and the rate of temperature rise can be controlled by adjusting the speed of descending these pins 6. By the way, the reference numeral 7 denotes a covering member.

The method of forming an insulating film according to this example is featured in that the controls of the temperature of substrate and the rate of temperature rise in the formation of the insulating film are effected through an adjustment of the distance between the hot plate 1 and the Si substrate 4. Followings are more detailed explanations of forming the film according to this example.

First of all, a varnish comprising a precursor of polymethyl siloxane dissolved in a solvent is coated on the Si substrate 4 by making use of a coater (not shown).

Then, the Si substrate 4 is mounted on the hot plate 1 heated to a temperature of 450° C. Then, through the adjustment of the height of pins 6, the distance between the hot plate 1 and the Si substrate 4 is controlled so as to maintain the temperature of the Si substrate 4 to 80° C. Thereafter, the covering member 7 is placed in position under this condition, and then, the atmosphere inside the covering member 7 is replaced by a nitrogen atmosphere. Then, the Si substrate 4 is heat-treated in this nitrogen atmosphere for one minute at a temperature of 80° C.

Then, through the adjustment of the height of pins 6, the distance between the hot plate 1 and the Si substrate 4 is controlled so as to maintain the temperature of the Si substrate 4 to 200° C. Under this condition, the Si substrate 4 is further heat-treated in this nitrogen atmosphere for one minute at a temperature of 200° C.

Thereafter, the descending speed of pins 6 is adjusted so as to obtain the same thermal history as that shown in FIG. 5, thereby raising the temperature of the Si substrate 4 up to 450° C. at a rate of 50° C./min. so as to perform an additional heat treatment of the Si substrate 4 for 30 minutes, thus accomplishing the formation of the insulating film.

When the relationship between the relative dielectric constant of the insulating film obtained according to this method and the crack-resistant film thickness of the insulating film was investigated, the same results as shown in FIG. 6 could be obtained. Further, when the relationship between the rate of temperature rise until the temperature of substrate reaches 450° C. and the crack-resistant film thickness of the resultant insulating film having a relative dielectric constant of 2.5, and a relationship between the rate of temperature rise until the temperature of substrate reaches 450° C. and the Vickers hardness of this insulating film were investigated, the same results as shown in FIG. 7 could be obtained.

In the foregoing description, examples according to the first aspect of this invention have been explained. However, it should not be construed that the first aspect of this invention is limited to only the aforementioned examples. For example, in the aforementioned examples, an organic SOG film consisting of polymethyl siloxane is employed as an insulating film. However, an inorganic insulating film consisting of an inorganic material such as hydrogen silsesquioxane or an organic insulating film consisting of an organic material such as polyallylene ether can be also employed for obtaining almost the same effects as mentioned above. Although the aforementioned films are all formed of a low dielectric material, it is possible, even in the formation of an insulating film consisting of a ferroelectric material such as strontium bismuth titanium oxide (SBT), to obtain a film having a higher crack-resistant film thickness as compared with the conventional film by raising the temperature of a film at a rate of 200° C./min. or less using a single sheet of hot plate.

As for the device to which the insulating film according to the first aspect of this invention can be effectively applied, a device having a small interwiring capacity or a device demanding a small interlayer capacity, e.g. a DRAM of high-integration of 1GB and a logic device with size of 0.3 $\mu$m of less can be exemplified. Further, the substrate is not confined to an Si substrate, but may be other kinds of substrate such as an SOI substrate.

As explained above, it is possible according to this example to form a film, in particular, an insulating film by means of a coating method using a hot plate without inviting a deterioration of the crack-resistant film thickness and of the mechanical strength thereof.

EXAMPLE 3

This example relates to a second aspect of this invention.

FIGS. 9A to 9D show respectively a cross-sectional view illustrating the manufacturing steps of a semiconductor device according to a third example of this invention.

Figure 9A:
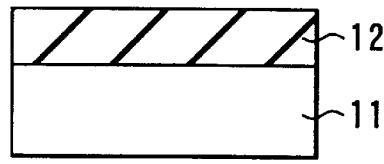
FIGS. 9A, 9B, 9C and 9D illustrate respectively a cross-sectional view illustrating the manufacturing steps of a semiconductor device according to a third example of this invention.

First of all, as shown in FIG. 9A, a liquid raw material 12 for forming an organic SOG (spin on glass) film is coated on a semiconductor substrate 11. This liquid raw material 12 has a composition similar to that used in EXAMPLE 1.

Figure 9B:
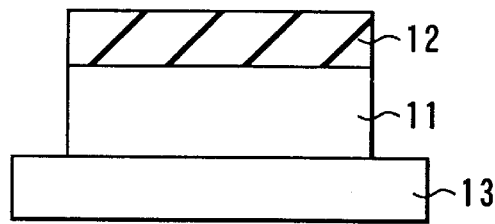

Next, as shown in FIG. 9B, the semiconductor substrate 11 is mounted on a hot plate 13 to perform a sequence of heat treatments in air atmosphere, i.e. a 5-minute heat treatment at 80° C., followed by additional 5-minute heat treatment at 200° C., thereby volatilizing the solvent in the liquid raw material 12.

Figure 9C:
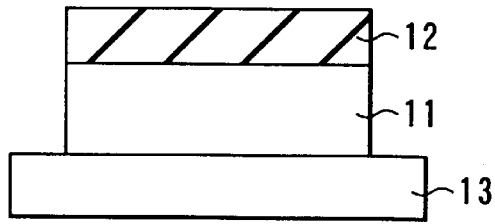
Figure 9D:
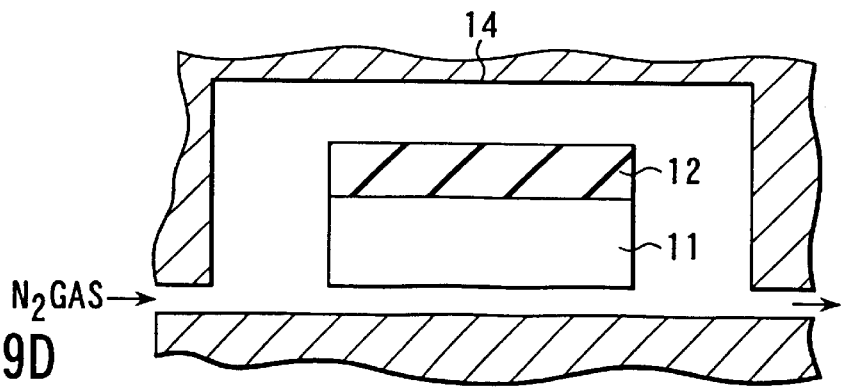

Then, as shown in FIG. 9C, the semiconductor substrate 11 is mounted on a hot plate 13 to perform a heat treatments in air atmosphere for 5 minutes at a temperature ranging from 250° C. to 350° C. Thereafter, as shown in FIG. 9D, the semiconductor substrate 11 is placed in a diffusion furnace 14 and heat-treated for 60 minutes at a temperature of 450° C. while introducing a $N_2$ gas into the diffusion furnace 14, thereby allowing a crosslinking reaction to be proceeded, thus curing the organic SOG film 12.

The organic SOG film 12 formed according to the aforementioned manufacturing steps was confirmed to have an excellent crack resistance and a lowered dielectric constant.

Next, reasons for realizing a high crack resistance and a lowered dielectric constant in the insulating film which were achieved by the employment of the aforementioned manufacturing steps will be explained.

Figure 10:
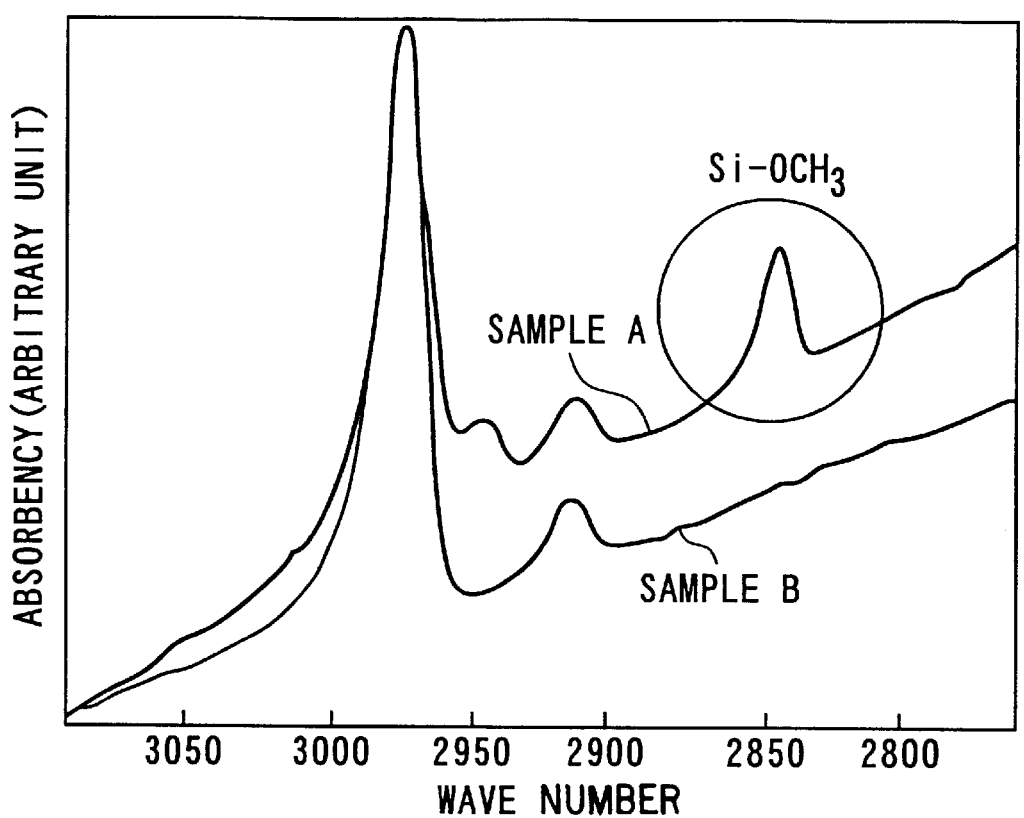
FIG. 10 is a graph illustrating a comparison between a film having a high crack resistance and a film having a low crack resistance on the results of spectrometry of FTIR.

First of all, the relationship between the crack resistance and the quality of film was investigated in detail by making use of an FTIR (Fourier Transform Infrared Spectrometer). FIG. 10 is a graph illustrating a comparison between a film having a high crack resistance and a film having a low crack resistance on the relation between absorption intensity and wave-number. In FIG. 10, a sample A represents the spectral properties of a film having a low crack resistance, while a sample B represents the spectral properties of a film having a high crack resistance.

The existence of Si—$OCH_3$ (silicon-methoxy bond) bond was recognized in the sample A exhibiting a low crack resistance, but was not recognized in the sample B. As a result, it was assumed that due to the existence of this Si—$OCH_3$ (silicon-methoxy bond) bond, the formation of network structure is suppressed, thereby deteriorating the mechanical strength of the film and also deteriorating the crack resistance.

Therefore, in an attempt to improve the crack resistance without inviting an increase of relative dielectric constant, the present inventors have studied on the conditions which can eliminate the Si—$OCH_3$ while enabling to preserve Si—$CH_3$ which is required for the lowering of relative dielectric constant.

Namely, an organic SOG film to be employed as an interlayer insulating film was formed by means of a coating method and then, subjected to a sequence of heat-treatments in air atmosphere depending on the boiling point of a solvent employed, i.e. a 5-minute heat treatment at 80° C., followed by additional 5-minute heat treatment at 200° C. Thereafter, the organic SOG film was further heated to a temperature ranging from 250° C. to 450° C. in air atmosphere to investigate the temperature dependency of the quantity of residual Si—$CH_3$ and of the quantity of residual Si—$OCH_3$ in the organic SOG film.

Figure 11:
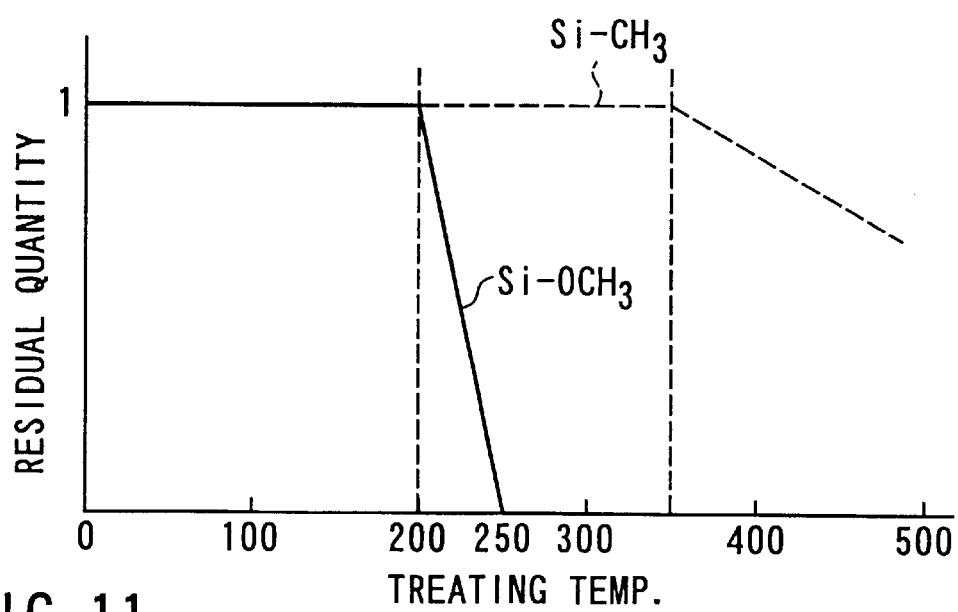
FIG. 11 is a graph illustrating the temperature dependency of the quantity of residual Si—$CH_3$ and of the quantity of residual Si—$OCH_3$ in an organic SOG film.

FIG. 11 is a graph illustrating the temperature dependency of the quantity of residual Si—$CH_3$ and of the quantity of residual Si—$OCH_3$ in an organic SOG film. As shown in FIG. 11, while the Si—$CH_3$ in the organic SOG film began to diminish at a temperature of 350° C. or more, the Si—$OCH_3$ in the organic SOG film began to diminish at a temperature of 200° C. or more and could be substantially vanished at a temperature of 250° C. or more.

Figure 12:
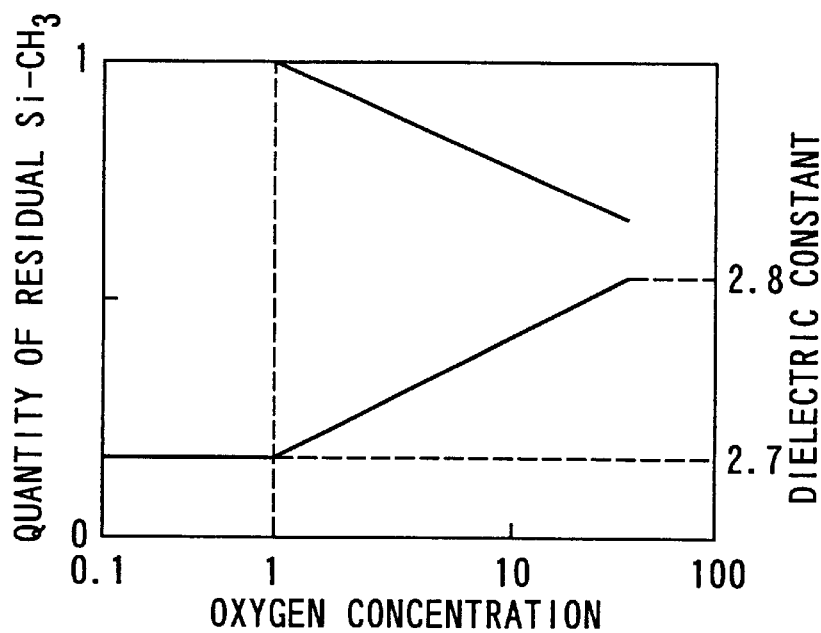
FIG. 12 is a graph illustrating the oxygen concentration dependency of the quantity of residual Si—$CH_3$ in an organic SOG film and of the relative dielectric constant.

Then, the relationship between the oxygen concentration and the quantity of residual Si—$CH_3$ as well as the relationship between the oxygen concentration and the relative dielectric constant of the organic SOG film when the organic SOG film was heat-treated at a temperature of 450° C. were investigated. FIG. 12 is a graph illustrating the oxygen concentration dependency of the quantity of residual Si—$CH_3$ in the organic SOG film and of the relative dielectric constant of the organic SOG film. As clearly shown in FIG. 12, when the oxygen concentration is 1% or less, the Si—$CH_3$ can be preserved in the organic SOG film, thereby making it possible to suppress the relative dielectric constant from being increased.

Therefore, the crack resistance of the organic SOG film can be improved by conducting the heat treatment thereof under such a condition that the film is heat-treated for 5 minutes in air atmosphere at a temperature of 80° C., followed by an additional heat treatment of 5 minutes at a temperature of 200° C., thereby volatilizing the solvent in the film, after which the organic SOG film is further heat-treated in an oxidizing atmosphere such as air atmosphere at a temperature ranging from 200° C. to 350° C., thereby eliminating the Si—OCH$_3$. Additionally, when the organic SOG film is further heat-treated in a non-oxidizing atmosphere having an oxygen concentration of not more than 1% for instance at a temperature of 450° C. for 60 minutes, any increase of relative dielectric constant of the film can be suppressed while allowing the polymerization of the film to proceed without substantially accompanying the decomposition of the Si—CH$_3$. By the way, the temperature range of 200° C. to 350° C. on the occasion of eliminating the Si—OCH$_3$ is advantageous in the respect that the elimination rate of the Si—OCH$_3$ will be enhanced, thereby improving the productivity.

Next, an organic SOG film which was formed by the aforementioned process, an organic SOG film which was heat-treated in air atmosphere at a temperature of 450° C., and an organic SOG film which was heat-treated at a temperature of 450° C. in a nitrogen atmosphere (not more than 1% in oxygen concentration; a non-oxidizing atmosphere) of 1 atm. were prepared to compare with each other on the crack resistance and relative dielectric constant thereof. The evaluation of the crack resistance was performed by measuring a minimum film thickness which allowed to generate the cracking thereof due to a stress inside the film itself. Namely, the larger the minimum film thickness which allowed to generate the cracking, the higher the crack resistance of the film is.

Figure 13A:
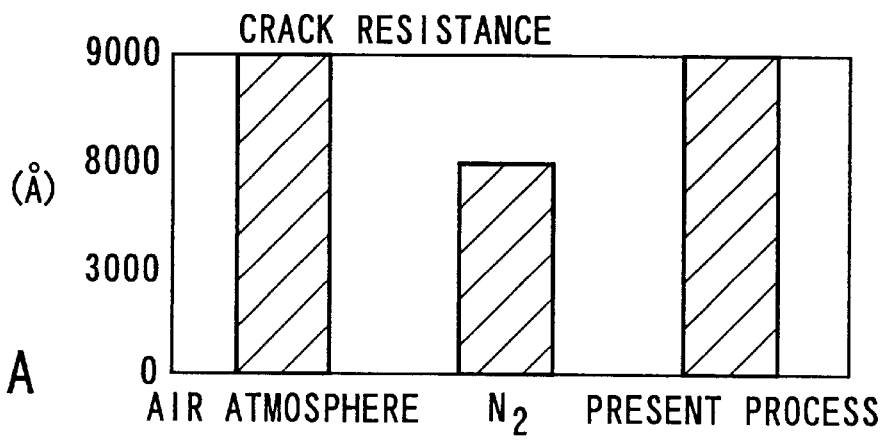
FIGS. 13A and 13B are graphs illustrating respectively the crack resistance and relative dielectric constant of an insulating film.
Figure 13B:
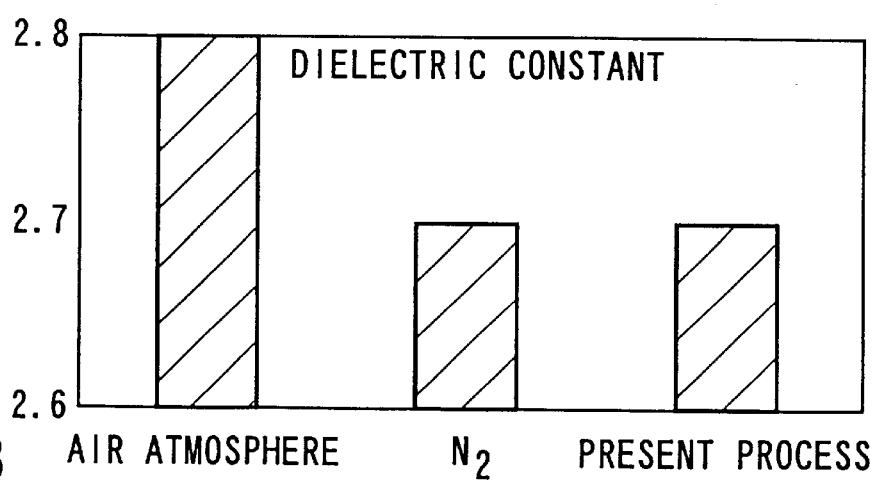

FIG. 13A shows the crack resistance of the film, while FIG. 13B shows the relative dielectric constant of the film. As shown in FIGS. 13A and 13B, it is possible through the employment of the aforementioned process to improve the crack resistance and to suppress the increase of the relative dielectric constant. Moreover, in addition to the suppress of increase in the relative dielectric constant of the film, the film was also excellent in suppressing the degassing and moisture absorption thereof.

As explained above, it becomes possible, by making use of the aforementioned process, to minimize the unreacted portion of the insulating film and to preserve the Si—CH$_3$, thereby suppressing the degassing, moisture absorption, increase of relative dielectric constant and the generation of cracks.

By the way, this invention should not be construed to be limited to the aforementioned examples. For example, although an organic SOG film was employed in the aforementioned examples, it may be substituted by an organosilicon oxide film that can be formed through a CVD method.

Further, an air atmosphere was employed as an oxidizing atmosphere in the aforementioned examples, it may be substituted by an oxygen gas atmosphere. As for non-oxidizing atmosphere, a nitrogen gas atmosphere was employed in the aforementioned examples, it may be substituted by a reduced pressure atmosphere.

With respect to other features, this invention can be variously modified and executed within the scope of claims accompanying herewith.

As explained above, according to this invention, it is possible, by heat-treating an organosilicon oxide film in an oxidizing atmosphere and at a temperature of 200° C. or more, to minimize the quantity of residual Si—OCH$_3$ in the organosilicon oxide film and hence, to improve the crack resistance of the film.

Additionally, it is possible according to this invention to improve the crack resistance of the organosilicon oxide film and to suppress any increase of relative dielectric constant of the film by heat-treating the film in a non-oxidizing atmosphere and at a temperature of 400° C. or more after the organosilicon oxide film is heated in an oxidizing atmosphere and at a temperature ranging from 200° C. to 350° C.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of forming a film, which comprises the steps of:
    coating a liquid raw material comprising a precursor of film-forming material dissolved in a solvent on a surface of substrate; and
    forming a solid film on the surface of substrate by subjecting said substrate to a plurality of heat treatments differing in heating temperature from each other;
    wherein said heat treatments differing heating temperatures from each other are performed over the same single hot plate.

2. The method according to claim 1, wherein said film is an insulating film having a relative dielectric constant of 3.2 or less.

3. The method according to claim 2, wherein said insulating film contains Si and O.

4. The method according to claim 3, wherein said insulating film is an organic SOG (spin on glass) film.

5. A method of manufacturing a semiconductor device, which involves a film-forming process, said film-forming process comprising the steps of:
    coating a liquid raw material comprising a precursor of film-forming material dissolved in a solvent on a surface of substrate; and
    forming a solid film on the surface of substrate by subjecting said substrate to a plurality of heat treatments to heat said substrate at different temperatures, thereby allowing said precursor to take place a polymerization reaction thereof;
    wherein said heat treatments to heat said substrate at different temperatures are performed over the same single hot plate and raising the temperature at a rate of not more than 200° C./min. during the polymerization reaction.

6. The method according to claim 5, wherein the temperature is raised at a rate of not more than 100° C./min.

7. The method according to claim 5, wherein said film is an insulating film having a relative dielectric constant of 3.2 or less.

8. The method according to claim 7, wherein said insulating film contains Si and O.

9. The method according to claim 8, wherein said insulating film is an organic SOG (spin on glass) film.

10. A method of manufacturing a semiconductor device, which involves a film-forming process, said film-forming process comprising the steps of:
    coating a liquid raw material on a surface/of substrate; and
    forming a solid film on the surface of substrate by subjecting said substrate to a plurality of heat treatments to heat said substrate at different temperatures;
    wherein said heat treatments to heat said substrate at different temperatures are performed over the same single hot plate, subjecting said substrate to a heat treatment where said substrate is heated at a temperature of 200° C. or more, and to another heat treatment where said substrate heated to a temperature of 200° C. or more is further heated raising the temperature at a rate of not more than 200° C./min.

11. The method according to claim 10, wherein the temperature is raised at a rate of not more than 100° C./min.

12. The method according to claim 10, wherein said film is an insulating film having a relative dielectric constant of 3.2 or less.

13. The method according to claim 12, wherein said insulating film contains Si and O.

14. The method according to claim 13, wherein said insulating film is an organic SOG (spin on glass) film.

15. A method of manufacturing a semiconductor device, which comprises the steps of:

coating a liquid raw material for forming an organosilicon oxide film on a surface of semiconductor substrate; and subjecting said semiconductor substrate to a heat treatment where said semiconductor substrate is heated in an oxidizing atmosphere and at a temperature of 200° C. or more.

16. The method according to claim 15, wherein said heat treatment is performed at a temperature ranging from 200 to 350° C.

17. The method according to claim 15, which further comprises another heat treatment for heat-treating the semiconductor substrate in a non-oxidizing atmosphere and at a temperature of 400° C. or more in subsequent to said heat treatment.

18. The method according to claim 15, wherein said organosilicon oxide film contains Si atom, $CH_3$ group and O atom.

* * * * *

UNITED STATES PATENT AND TRADEMARK OFFICE
CERTIFICATE OF CORRECTION

PATENT NO.   : 6,458,713 B1
DATED        : October 1, 2002
INVENTOR(S)  : Yamada et al.

It is certified that error appears in the above-identified patent and that said Letters Patent is hereby corrected as shown below:

Column 12,
Line 61, change "surface/of" to -- surface of --.

Signed and Sealed this

Twenty-second Day of April, 2003

JAMES E. ROGAN
*Director of the United States Patent and Trademark Office*